(12) United States Patent
Abe et al.

(10) Patent No.: US 11,814,748 B2
(45) Date of Patent: Nov. 14, 2023

(54) METHOD FOR PRODUCING LITHIUM TANTALATE SINGLE CRYSTAL SUBSTRATE

(71) Applicant: SHIN-ETSU CHEMICAL CO., LTD., Tokyo (JP)

(72) Inventors: Jun Abe, Takasaki (JP); Koji Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/448,963

(22) Filed: Sep. 27, 2021

(65) Prior Publication Data

US 2022/0098756 A1    Mar. 31, 2022

(30) Foreign Application Priority Data

Sep. 28, 2020    (JP) .................................. 2020-162245

(51) Int. Cl.
*C30B 29/30* (2006.01)
*C30B 15/00* (2006.01)

(52) U.S. Cl.
CPC .............. *C30B 29/30* (2013.01); *C30B 15/00* (2013.01)

(58) Field of Classification Search
CPC ........... C30B 29/30; C30B 15/00; C30B 1/02; C30B 33/02
See application file for complete search history.

(56) References Cited

U.S. PATENT DOCUMENTS

| 3,997,687 | A | * | 12/1976 | Phillips | ................ | G02B 6/1342 |
| | | | | | | 427/377 |
| 2004/0062709 | A1 | * | 4/2004 | Higashi | .................. | B82Y 30/00 |
| | | | | | | 423/594.17 |
| 2018/0135204 | A1 | * | 5/2018 | Kajigaya | ................. | C30B 29/20 |

FOREIGN PATENT DOCUMENTS

| JP | 2017/165611 | * | 9/2017 |
| JP | 2017-165611 A | | 9/2017 |

(Continued)

OTHER PUBLICATIONS

Office Action dated Apr. 4, 2023, in corresponding Japanese Patent Application No. 2020-162245, 3 pages.

*Primary Examiner* — Robert M Kunemund
(74) *Attorney, Agent, or Firm* — Oblon, McClelland, Maier & Neustadt, L.L.P.

(57) ABSTRACT

Provided is a method for producing a lithium tantalate single crystal substrate capable of suppressing increase in volume resistivity of the lithium tantalate single crystal substrate owing to reduction failure even when a lithium carbonate power is repeatedly used in heat treatment for the lithium tantalate single crystal substrate. The invention is a method for producing a lithium tantalate single crystal substrate having a volume resistivity of $1\times10^{10}$ Ω·cm or more and less than $1\times10^{12}$ Ω·cm, including a step of heat-treating a lithium tantalate single crystal substrate having a volume resistivity of $1\times10^{12}$ Ω·cm or more and having a single-domain structure, under normal pressure and at a temperature of 350° C. or higher but not higher than the Curie temperature thereof while burying it in a lithium carbonate powder having a BET specific surface area of 0.13 m²/g or more, wherein the lithium carbonate powder is a used lithium carbonate powder that has been used in burying a lithium tantalate single crystal substrate in heat treatment for the lithium tantalate single crystal structure under normal pressure and at a (Continued)

temperature of 350° C. or higher but not higher than the Curie temperature thereof, and in the heat treatment step, the heat treatment is carried out in a mixed gas atmosphere of an inert gas and a reducing gas at the start of the heat treatment, and after the heat treatment in the mixed gas atmosphere, the heat treatment is carried out in a single gas atmosphere of an inert gas.

9 Claims, 4 Drawing Sheets

(56) References Cited

FOREIGN PATENT DOCUMENTS

| | | |
|---|---|---|
| JP | 2020-11874 A | 1/2020 |
| JP | 2020-40840 A | 3/2020 |

* cited by examiner

METHOD FOR PRODUCING LITHIUM TANTALATE SINGLE CRYSTAL SUBSTRATE

FIELD OF THE INVENTION

The present invention relates to a method for producing a lithium tantalate single crystal substrate for use for surface acoustic wave devices.

BACKGROUND OF THE INVENTION

A lithium tantalate ($LiTaO_3$; LT) single crystal has piezoelectricity and is used as a piezoelectric substrate of a surface acoustic wave device. On the other hand, a lithium tantalate single crystal also has pyroelectricity, and a charge is generated on the surface by a change in temperature. Such pyroelectricity may be used as a sensor, but when using a lithium tantalate crystal as a piezoelectric substrate of a surface acoustic wave device, this pyroelectricity can be a problem.

For example, when a piezoelectric substrate is charged due to temperature change, electrostatic discharge occurs in the piezoelectric substrate, which may cause cracking or breaking. In addition, there is a possibility that an electrode formed on the surface of a piezoelectric substrate may be short-circuited by static electricity.

Therefore, in order to suppress the charging of a lithium tantalate substrate, a method of reducing the lithium tantalate substrate at a temperature not higher than the Curie temperature thereof is taken into consideration and is widely carried out (for example, see PTL 1). PTL 1 discloses a method for producing a lithium tantalite single crystal substrate having a highly homogeneous volume resistivity by buried reduction of a lithium tantalate single crystal substrate in a lithium carbonate powder.

CITATION LIST

Patent Literature

PTL 1: JP 2017-165611A

SUMMARY OF THE INVENTION

Technical Problem

In reduction of a lithium tantalate substrate, a lithium carbonate powder is not reduced and therefore, it is considered that a lithium carbonate powder can be repeatedly used in reduction of a lithium tantalate substrate. However, when a lithium carbonate powder used in reduction of a lithium tantalate substrate is used again, the lithium tantalate substrate could not be reduced sufficiently and the volume resistivity of the lithium tantalate substrate may be larger than $1\times10^{12}$ Ω·cm as the case may be. In addition, the volume resistivity of the lithium tantalate substrate may often fluctuate.

Given the situation, an object of the present invention is to provide a method for producing a lithium tantalate single crystal substrate capable of suppressing increase in volume resistivity of the lithium tantalate single substrate owing to reduction failure even when a lithium carbonate power is repeatedly used in heat treatment for the lithium tantalate single crystal substrate.

Solution to Problem

The present inventors have assiduously studied for the purpose of attaining the above-mentioned object and, as a result, have found that, when a lithium carbonate powder is used in reduction of a lithium tantalate substrate, the BET specific surface area of the lithium carbonate powder reduces, and therefore when a lithium tantalate substrate is reduced by reuse of the lithium carbonate powder, the volume resistivity of the lithium tantalate substrate increases, and have completed the following invention. The present invention is as follows.

[1] A method for producing a lithium tantalate single crystal substrate having a volume resistivity of $1\times10^{10}$ Ω·cm or more and less than $1\times10^{12}$ Ω·cm, including a step of heat-treating a lithium tantalate single crystal substrate having a volume resistivity of $1\times10^{12}$ Ω·cm or more and having a single-domain structure, under normal pressure and at a temperature of 350° C. or higher but not higher than the Curie temperature thereof while burying it in a lithium carbonate powder having a BET specific surface area of 0.13 $m^2/g$ or more, wherein the lithium carbonate powder is a used lithium carbonate powder that has been used in burying a lithium tantalate single crystal substrate in heat treatment for the lithium tantalate single crystal structure under normal pressure and at a temperature of 350° C. or higher but not higher than the Curie temperature thereof, and in the heat treatment step, the heat treatment is carried out in a mixed gas atmosphere of an inert gas and a reducing gas at the start of the heat treatment, and after the heat treatment in the mixed gas atmosphere, the heat treatment is carried out in a single gas atmosphere of an inert gas.

[2] The method for producing a lithium tantalate single crystal substrate according to the above [1], wherein in an adsorption isotherm obtained in measurement of the BET specific surface area of the lithium carbonate powder, in which the horizontal axis is a relative pressure (adsorption equilibrium pressure (P)/saturation vapor pressure ($P_0$)) and the vertical axis is an adsorbed amount ($cm^3/g$), the inclination of the adsorption isotherm is 0.04 or more at a relative pressure ($P/P_0$) falling within a range of 0.2 or more and 0.8 or less.

[3] The method for producing a lithium tantalate single crystal substrate according to the above [1] or [2], wherein the lithium carbonate powder is a lithium carbonate powder obtained by exposing the used lithium carbonate powder to an air atmosphere, and a product of the absolute humidity of the air atmosphere and the time for which the used lithium carbonate powder has been exposed to the air atmosphere is 200 ($g/m^3$)·hr or more.

[4] The method for producing a lithium tantalate single crystal substrate according to any one of the above [1] to [3], wherein the lithium carbonate powder is a lithium carbonate powder obtained by exposing the used lithium carbonate powder to an air atmosphere, and a product of the absolute humidity of the air atmosphere and the time for which the used lithium carbonate powder has been exposed to the air atmosphere is 300 ($g/m^3$)·hr or more.

[5] The method for producing a lithium tantalate single crystal substrate according to any one of the above [1] to [4], wherein the lithium carbonate powder is a lithium carbonate powder obtained by exposing the used lithium carbonate powder to an air atmosphere, the absolute humidity of the air atmosphere is 40 $g/m^3$ or more, and a product of the absolute humidity of the air atmosphere and the time for which the used lithium carbonate powder has been exposed to the air atmosphere is 300 ($g/m^3$)·hr or more.

Advantageous Effects of the Invention

According to the present invention, there can be provided a method for producing a lithium tantalate single crystal substrate capable of suppressing increase in volume resistivity of the lithium tantalate single substrate owing to reduction failure even when a lithium carbonate power is repeatedly used in heat treatment for the lithium tantalate single crystal substrate.

DETAILED DESCRIPTION OF THE INVENTION

Figure 1:
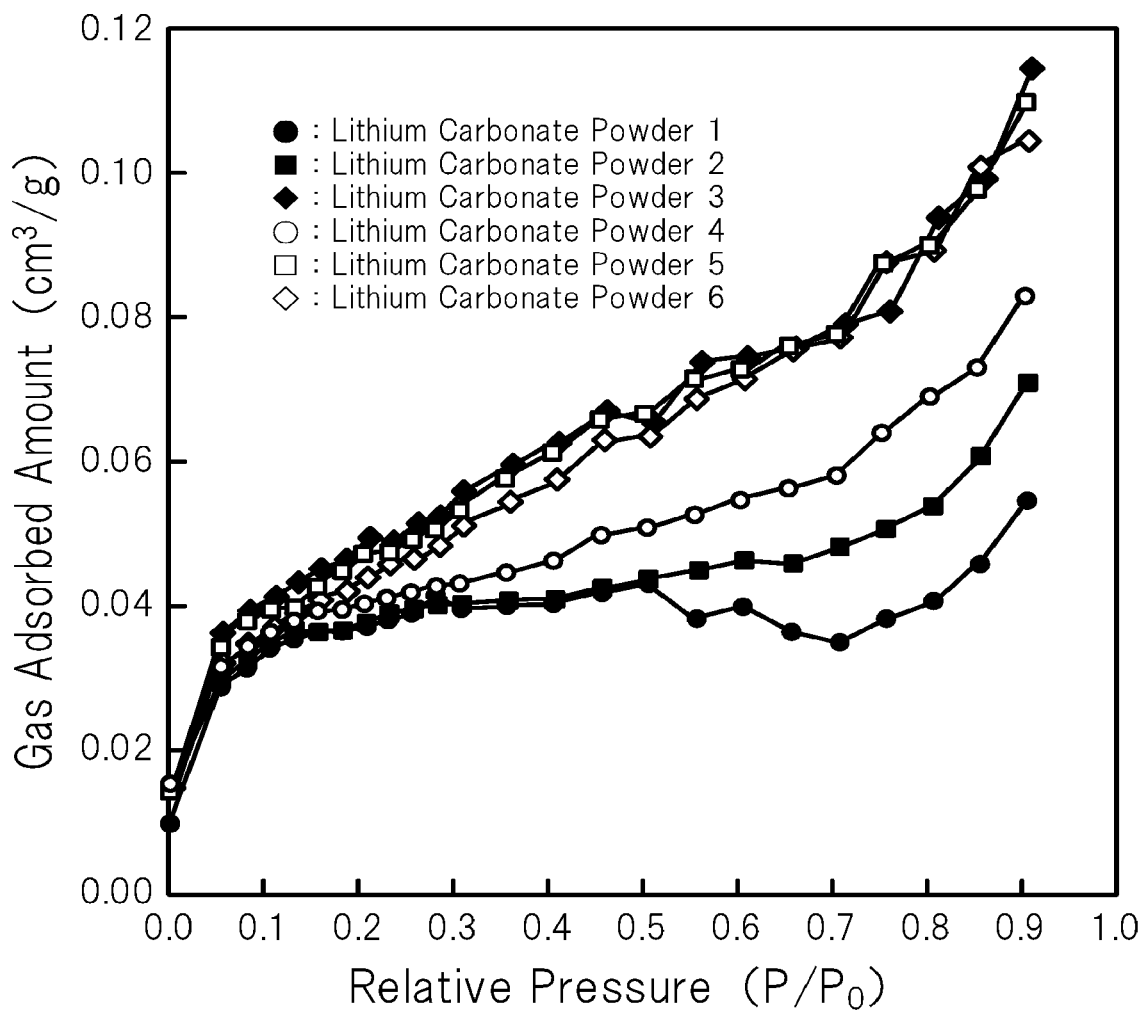
FIG. 1 is a graph showing an adsorption isotherm of a lithium carbonate powder used in production of a lithium tantalate single crystal substrate in Examples and Comparative Examples.

[Production Method for Lithium Tantalate Single Crystal Substrate]

Hereinunder, an embodiment of the present invention is described in detail, but the present invention is not whatsoever restricted by the description.

The method for producing a lithium tantalate single crystal substrate of one embodiment of the present invention is a method for producing a lithium tantalate single crystal substrate having a volume resistivity of $1\times10^{10}$ Ω·cm or more and less than $1\times10^{12}$ Ω·cm, including a step of heat-treating a lithium tantalate single crystal substrate having a volume resistivity of $1\times10^{12}$ Ω·cm or more and having a single-domain structure, under normal pressure and at a temperature of 350° C. or higher but not higher than the Curie temperature thereof while burying it in a lithium carbonate powder having a BET specific surface area of 0.13 $m^2/g$ or more. In the method, the lithium carbonate powder is a used lithium carbonate powder that has been used in burying a lithium tantalate single crystal substrate in heat treatment for the lithium tantalate single crystal structure under normal pressure and at a temperature of 350° C. or higher but not higher than the Curie temperature thereof. Further, in the heat treatment step, the heat treatment is carried out in a mixed gas atmosphere of an inert gas and a reducing gas at the start of the heat treatment, and after the heat treatment in the mixed gas atmosphere, the heat treatment is carried out in a single gas atmosphere of an inert gas.

In the production method for a lithium tantalate single crystal substrate of one embodiment of the present invention, first, a lithium tantalate single crystal substrate having a volume resistivity of $1\times10^{12}$ Ω·cm or more and having a single-domain structure is prepared. Such a lithium tantalate single crystal structure can be obtained, for example, by growing a lithium tantalate single structure according to a Czochralski method, and subjecting the resultant ingot to polarization treatment and working it into a substrate shape.

Next, the prepared lithium tantalate single crystal substrate is buried in a lithium carbonate powder. In the case where the lithium carbonate powder is an unused one, the lithium carbonate powder is preferably a lithium carbonate powder having a maximum particle size of 500 μm or less, more preferably a lithium carbonate powder having a maximum particle size of 300 μm or less. A lithium carbonate powder having a maximum particle size of 500 μm or less can be obtained, for example, by screening a commercially-available lithium carbonate powder through a 32-mesh sieve (having an opening of 500 μm). A lithium carbonate powder having a maximum particle size of 300 μm or less can be obtained, for example, by screening a commercially-available lithium carbonate powder through a 48-mesh sieve (having an opening of 300 μm). By removing a bulky lithium carbonate powder through such a sieve, a lithium tantalate single crystal substrate that is highly homogeneous in the in-plane direction with no color unevenness on the surface of the substrate can be obtained. The opening of the sieve can be made further smaller, but at around 80 mesh (with an opening of 180 μm), such a sieve may be readily clogged with a lithium carbonate powder so that the workability therewith may worsen, and therefore the maximum particle size of the lithium carbonate powder is preferably 180 μm or more.

On the other hand, in the case where the lithium carbonate powder is a used lithium carbonate powder that has been used in burying a lithium tantalate single crystal substrate in heat treatment for the lithium tantalate single crystal structure under normal pressure and at a temperature of 350° C. or higher but not higher than the Curie temperature thereof, the BET specific surface area of the lithium carbonate powder needs to be 0.13 $m^2/g$ or more. When a used lithium carbonate powder has a BET specific surface area of less than 0.13 $m^2/g$ and when a lithium tantalate single crystal substrate is buried in the used lithium carbonate powder and heat-treated in that condition, the volume resistivity of the lithium tantalate single crystal substrate may be $1\times10^{12}$ Ω·cm or more owing to reduction failure of the lithium tantalate single crystal substrate. From such a viewpoint, the BET specific surface area of the used lithium carbonate powder is preferably 0.14 $m^2/g$ or more, more preferably 0.15 $m^2/g$ or more. The upper limit of the BET specific surface area of the used lithium carbonate powder is not specifically limited, and may be, for example, 0.20 $m^2/g$ or less.

When the BET specific surface area of the used lithium carbonate powder is less than 0.13 $m^2/g$, the lithium carbonate powder may be processed in a predetermined manner to have a BET specific surface area of not less than 0.13 $m^2/g$. For example, a used lithium carbonate powder that has come to have a BET specific surface area of less than 0.13 $m^2/g$ owing to use thereof for heat treatment of a lithium tantalate single crystal substrate is preferably exposed to an air atmosphere. In that case, preferably, a product of the absolute humidity of the air atmosphere and the time for which the used lithium carbonate powder has been exposed to the air atmosphere is 200 $(g/m^3)\cdot hr$ or more. Accordingly, the used lithium carbonate powder can more surely have a BET specific surface area of 0.13 $m^2/g$ or more. In that manner, a used lithium carbonate powder that could no more be used in heat treatment of a lithium tantalate single crystal substrate can be readily changed to one that can be used in heat treatment of a lithium tantalate single crystal substrate. From that viewpoint, more preferably, the product of the absolute humidity of the air atmosphere and the time for which the used lithium carbonate powder has been exposed to the air atmosphere is 300 (g/m$^3$)·hr or more, even more preferably, the product of the absolute humidity of the air atmosphere and the time for which the used lithium carbonate powder has been exposed to the air atmosphere is 400 (g/m$^3$)·hr or more. Still more preferably, the absolute humidity of the air atmosphere is 40 g/m$^3$ or more, and the product of the absolute humidity of the air atmosphere and the time for which the used lithium carbonate powder has been exposed to the air atmosphere is 300 (g/m$^3$)·hr or more, and still further more preferably, the absolute humidity of the air atmosphere is 40 g/m$^3$ or more, and the product of the absolute humidity of the air atmosphere and the time for which the used lithium carbonate powder has been exposed to the air atmosphere is 400 (g/m$^3$)·hr or more, From the viewpoint of shortening the time for which the used lithium carbonate powder is exposed to an air atmosphere and stabilizing the volume resistivity of the resultant lithium tantalate single crystal substrate, the absolute humidity of the air atmosphere to which the used lithium carbonate powder is exposed to the air atmosphere is preferably 40 g/m$^3$ or more, more preferably 50 g/m$^3$ or more, even more preferably 60 g/m$^3$ or more, further more preferably 70 g/m$^3$ or more.

Also from the viewpoint of shortening the time for which the used lithium carbonate powder is exposed to an air atmosphere and stabilizing the volume resistivity of the resultant lithium tantalate single crystal substrate, the temperature of the air atmosphere to which the used lithium carbonate powder is exposed to the air atmosphere is preferably 10 to 80° C., more preferably 20 to 75° C., even more preferably 30 to 70° C., further more preferably 40 to 65° C.

The pressure of the air atmosphere to which the used lithium carbonate powder is exposed may be an atmospheric pressure. For shortening the time for which the used lithium carbonate powder is exposed to the air atmosphere, the air atmosphere may be pressurized.

Subsequently, the lithium tantalate single crystal substrate buried in the lithium carbonate powder is heat-treated in a mixed gas atmosphere of an inert gas and a reducing gas, under normal pressure and at a temperature of 350° C. or higher but not higher than the Curie temperature thereof. In this, when the heat treatment is carried out at a temperature lower than 350° C., reduction could not be attained sufficiently as the case may be. On the other hand, when the heat treatment is carried out at a temperature higher than the Curie temperature, the lithium tantalate single crystal substrate may have a multi-domain structure as the case may be.

At the start, the heat treatment is carried out in a mixed gas atmosphere of an inert gas and a reducing gas. As the inert gas, for example, nitrogen and a rare gas such as argon or helium can be used, but relatively inexpensive nitrogen is preferably used. As the reducing gas, for example, any one can be arbitrarily selected from hydrogen ($H_2$), carbon monoxide (CO), hydrogen sulfide ($H_2S$), sulfur dioxide and nitrogen monoxide ($N_2O$), and from the viewpoint of easy handleability, hydrogen ($H_2$) or carbon monoxide (CO) is preferably used.

In the production method for a lithium tantalate single crystal substrate of one embodiment of the present invention, a mixed gas atmosphere of an inert gas and a reducing gas, in which, therefore lithium tantalate single crystal substrate can be sufficiently reduced only with a lithium carbonate powder. When the same reduction treatment is carried out in an inert gas atmosphere not containing a reducing gas, the reduction could not be sufficiently attained, and the reduction treatment needs to be carried out plural times. When multiple reduction is needed, not only the production cost may increase but also the total heat treatment time may increase to thereby increase the probability of generation of warping or cracking of the substrate, and such is unfavorable.

Preferably, the concentration of the reducing gas is 20.0% by volume or less, more preferably 10.0% by volume or less, even more preferably 5.0% by volume or less. This is because, when the concentration of the reducing gas is too high, there is a probability that the reduction may run on too much. A lithium tantalate single crystal substrate that has been reduced too much may be brittle or may too much blacken, and if so, there may occur a problem in a device production process. The lower limit of the range of the concentration of the reducing gas is not specifically limited, and may be, for example, 0.5% by volume or more.

After the heat treatment in the mixed gas atmosphere of an inert gas and a reducing gas, further heat treatment is carried out in a single gas atmosphere of an inert gas. Accordingly, fluctuation of the volume resistivity of the resultant lithium tantalate single crystal substrate can be suppressed.

In temperature rising in heat treatment, a mixed gas atmosphere is preferred. By controlling the time for the mixed gas atmosphere and the concentration of the reducing gas after temperature rising, the reduction degree of the lithium tantalate single crystal substrate can be controlled, and the volume resistivity of the lithium tantalate single crystal substrate can be thereby controlled. The heat treatment time in a mixed gas atmosphere after temperature rising is preferably 10 minutes to 8 hours, and the treatment time varies depending on the desired volume resistivity of the lithium tantalate single crystal substrate. From the viewpoint of increasing the in-plane homogeneousness of the lithium tantalate single crystal substrate, the heat treatment time in a single gas atmosphere of an inert gas is preferably longer. The heat treatment time in a single gas atmosphere of an inert gas is, for example, preferably 1 to 24 hours, more preferably 6 to 22 hours, even more preferably 7 to 20 hours.

In the case where a used lithium carbonate powder is used in heat treatment of a lithium tantalate single crystal substrate, in an adsorption isotherm obtained in measurement of the BET specific surface area of the lithium carbonate powder, in which the horizontal axis is a relative pressure (adsorption equilibrium pressure (P)/saturation vapor pressure ($P_0$)) and the vertical axis is an adsorbed amount (cm$^3$/g), preferably, the inclination of the adsorption isotherm is 0.04 or more at a relative pressure (P/$P_0$) falling within a range of 0.2 or more and 0.8 or less. Using such a used lithium carbonate powder having the adsorption isotherm as above for heat treatment of a lithium tantalate single crystal substrate, the volume resistivity of the resultant lithium tantalate single crystal substrate can be controlled more surely to fall within a range of 1×10$^{10}$ Ω·cm or more and less than 1×10$^{12}$ Ω·cm. From that viewpoint, the inclination of the adsorption isotherm is more preferably 0.05 or more, even more preferably 0.06 or more. The upper limit of the inclination range of the adsorption isotherm is not specifically limited and is, for example, 0.1 or less.

The BET specific surface area of an unused lithium carbonate powder is also preferably 0.13 m$^2$/g or more like that of the used lithium carbonate powder, more preferably 0.14 m$^2$/g or more, even more preferably 0.15 m$^2$/g or more. The upper limit of the range of the BET specific surface area of the unused lithium carbonate powder is not specifically limited and is, for example, 0.20 m$^2$/g or less. After such an unused lithium carbonate powder is used, the above-mentioned treatment is carried out, and thus, the BET specific surface area of the used lithium carbonate powder can be readily controlled to be 0.13 m$^2$/g or more, preferably 0.14 m$^2$/g or more, more preferably 0.15 m$^2$/g or more.

The inclination of the adsorption isotherm of an unused lithium carbonate powder is also preferably 0.04 or more like that of the used lithium carbonate powder, more preferably 0.05 or more, even more preferably 0.06 or more. The upper limit of the range of the inclination of the adsorption isotherm of the unused lithium carbonate powder is not specifically limited and is, for example, 0.1 or less. After such an unused lithium carbonate powder is used, the above-mentioned treatment is carried out, and thus, the inclination of the adsorption isotherm of the used lithium carbonate powder can be readily controlled to be preferably 0.04 or more, more preferably 0.05 or more, even more preferably 0.06 or more.

EXAMPLES

Hereinunder, the present invention described above is further described with reference to Examples, but the present invention is not restricted to Examples.

(Production of Lithium Tantalate Single Crystal Substrate)

First, a lithium tantalate single crystal was grown according to a Czochralski method, then the resulting ingot was processed by boring for single domain treatment, and sliced to give plural sheets of substrate (raw material substrate). At that time, the volume resistivity of the lithium tantalate single crystal substrate was 3.0×10$^{14}$ Ω·cm.

(Production of Used Lithium Carbonate Powder)

A lithium carbonate powder (by Honjo Chemical Corporation) was screened through a 48-mesh sieve (having an opening of 300 μm) to control the maximum particle size of the lithium carbonate powder to be 300 μm or less.

Subsequently, the single-domain lithium tantalate single crystal substrate buried in the lithium carbonate powder was heated up to a temperature of 570° C. under normal pressure while a nitrogen gas flow was kept applied thereto at 6 L/min and a hydrogen gas flow was thereto at 120 cc/min (hydrogen concentration 2.0% by volume), and processed for heat treatment for further 1 hour. Subsequently, the hydrogen gas was stopped, and the substrate was further heat-treated at a temperature of 570° C. for 8 hours.

(Production of Lithium Carbonate Powders 1 to 6)

The used lithium carbonate powder that had been used for heat treatment for the lithium tantalate single crystal substrate was taken out at room temperature, then screened through a 48-mesh sieve (having an opening of 300 μm) to control the maximum particle size of the lithium carbonate powder to be 300 μm or less, thereby producing a lithium carbonate powder 1. With that, using a constant-temperature constant-humidity tank (trade name: PL3J, by Espec Corporation), the lithium carbonate powder 1 was exposed to an air atmosphere under the condition shown in Table 1 to give lithium carbonate powders 2 to 6.

(Production of Heat-Treated Lithium Tantalate Single Crystal Substrates of Examples 1 to 4 and Comparative Examples 1 and 2)

Using the lithium carbonate powders 1 to 6, lithium tantalate single crystal substrates were heat-treated to produce heat-treated lithium tantalate single crystal substrates of Examples 1 to 4 and Comparative Examples 1 and 2. The heat treatment condition was the same as the heat treatment condition described in the above-mentioned section of Production of Used Lithium Carbonate Powder.

The lithium carbonate powders 1 to 6 were evaluated as follows.

(Adsorption Isotherm, BET Specific Surface Area, and Inclination of Adsorption Isotherm)

Figure 2:
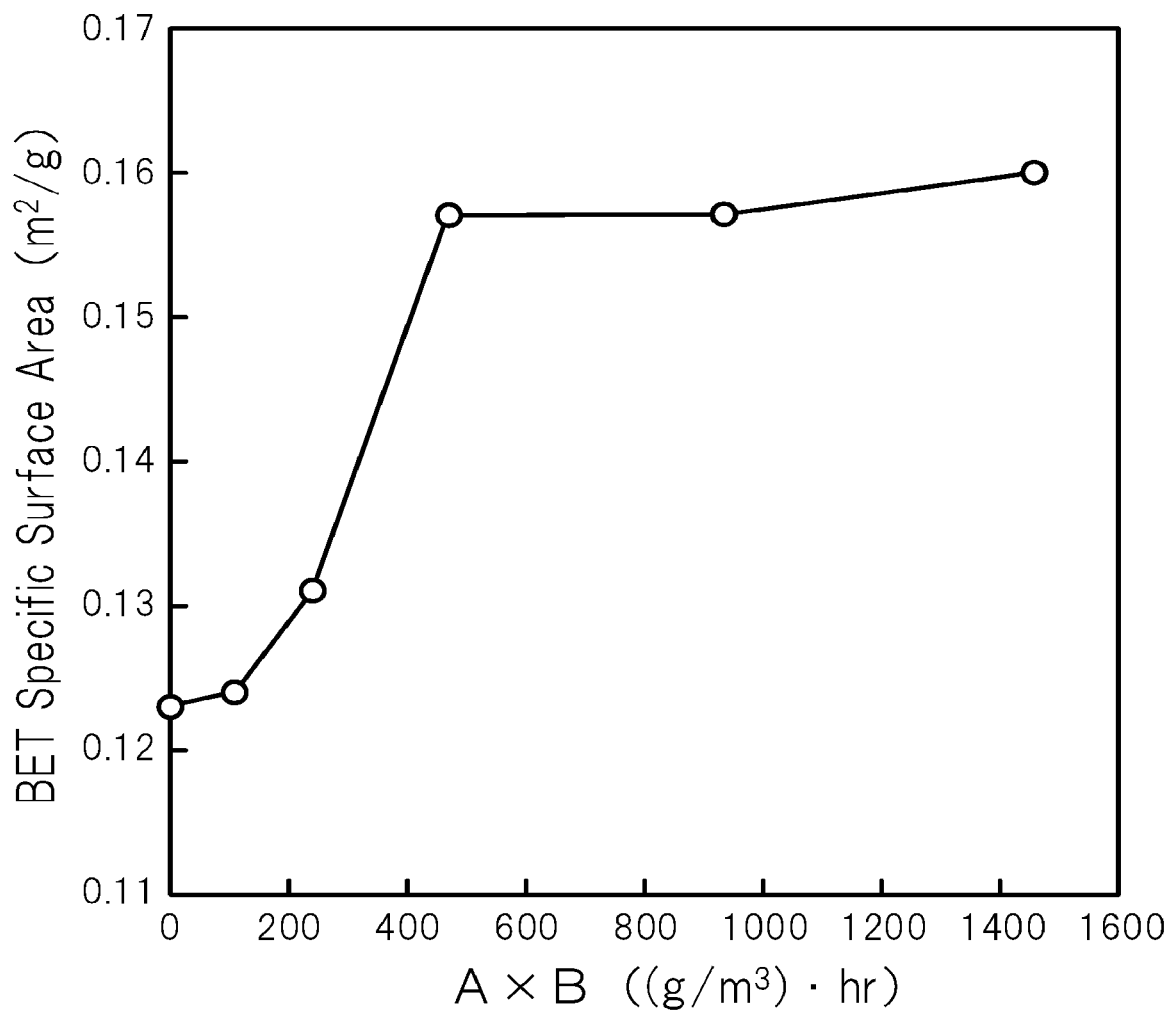
FIG. 2 is a graph showing a relationship between a product of an absolute humidity of an air atmosphere to which a lithium carbonate powder has been exposed and a time for which the lithium carbonate powder has been exposed to the air atmosphere, and a BET specific surface area of the lithium carbonate powder obtained by exposure to the air atmosphere.
Figure 3:
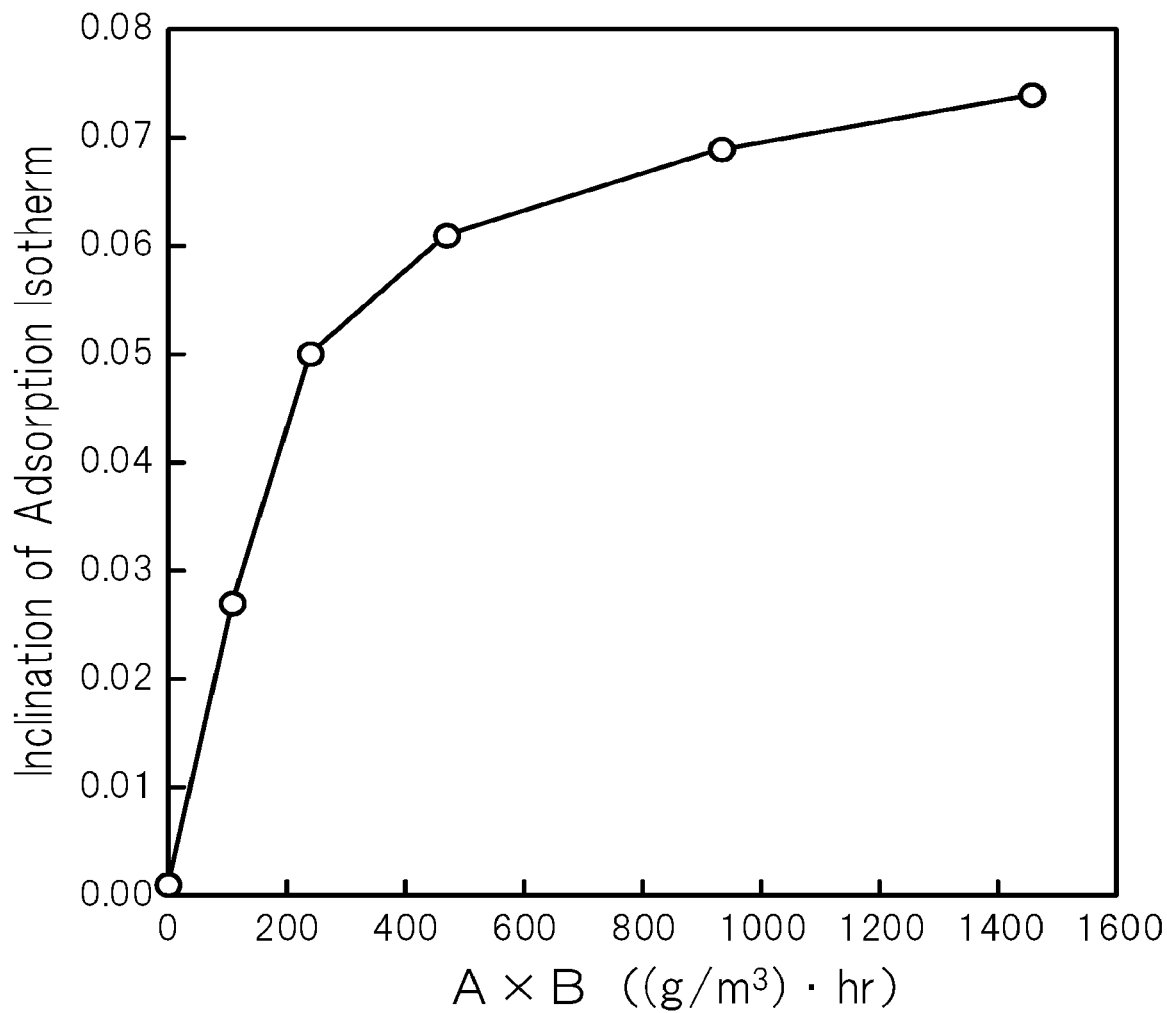
FIG. 3 is a graph showing a relationship between a product of an absolute humidity of an air atmosphere to which a lithium carbonate powder has been exposed and a time for which the lithium carbonate powder has been exposed to the air atmosphere, and an inclination of an adsorption isotherm of the lithium carbonate powder obtained by exposure to the air atmosphere.

Using "BELSORP-mini II" (by MicrotrackBEL Corporation), the adsorption isotherm, the BET specific surface area and the inclination of adsorption isotherm of lithium carbonate powders 1 to 6 were measured according to a constant capacity gas adsorption method. First, a sample was heated at 200° C. under a reduced pressure of 0.01 Pa for 2 hours with a heater. Based on the weight of the resultant sample, the relative pressure was increased at intervals of 0.025 from the measurement start relative pressure 0.0015 up to 0.3, and at interval of 0.05 from 0.3 to 0.9. A point at which the pressure variation for 5 minutes at each relative pressure reached 1% or less of the targeted pressure was referred to as an adsorbed amount at the relative pressure. The relative pressure was increased up to 0.9 to determine a relationship between the relative pressure (P/P$_0$) and the adsorbed amount (adsorption isotherm). From the adsorption isotherm, a BET specific surface area and an inclination of adsorption isotherm were obtained. The inclination of adsorption isotherm was measured by dividing a value obtained by subtracting the adsorbed amount (cm$^3$/g) at a relative pressure (P/P$_0$) of 0.2 from the adsorbed amount (cm$^3$/g) at a relative pressure (P/P$_0$) of 0.8, by 0.6 (=0.8-0.2). The results are shown in Table 1 and FIG. 1. In addition, a relationship between the product of an absolute humidity of an air atmosphere (g/m$^3$) (A) and a time for which the lithium carbonate powder was exposed to an air atmosphere (hr) (B) ((g/m$^3$)·hr) (A×B), and a relationship between the BET specific surface area and the inclination of adsorption isotherm are shown in FIG. 2 and FIG. 3, respectively.

The heat-treated lithium tantalate single crystal substrates of Examples 1 to 4 and Comparative Examples 1 and 2 were evaluated as follows.

(Volume Resistivity)

Using a digital insulation resistance meter (trade name: Agilent 4339B High Resistance Meter by Agilent Technologies Corporation) and a measurement tool (trade name: 16008B Resistivity Cell, by Agilent Technologies Corporation), the volume resistivity of the lithium tantalate single crystal substrates was measured. First, the lithium tantalate single crystal substrate was set on the measurement tool, and a voltage of 500 V was applied thereto for 1 minute to measure the volume resistance value of the lithium tantalate single crystal substrate. From the measured volume resistance value, the volume resistivity of the lithium tantalate single crystal substrate was calculated. The results are shown in Table 2.

(L Value)

Figure 4:
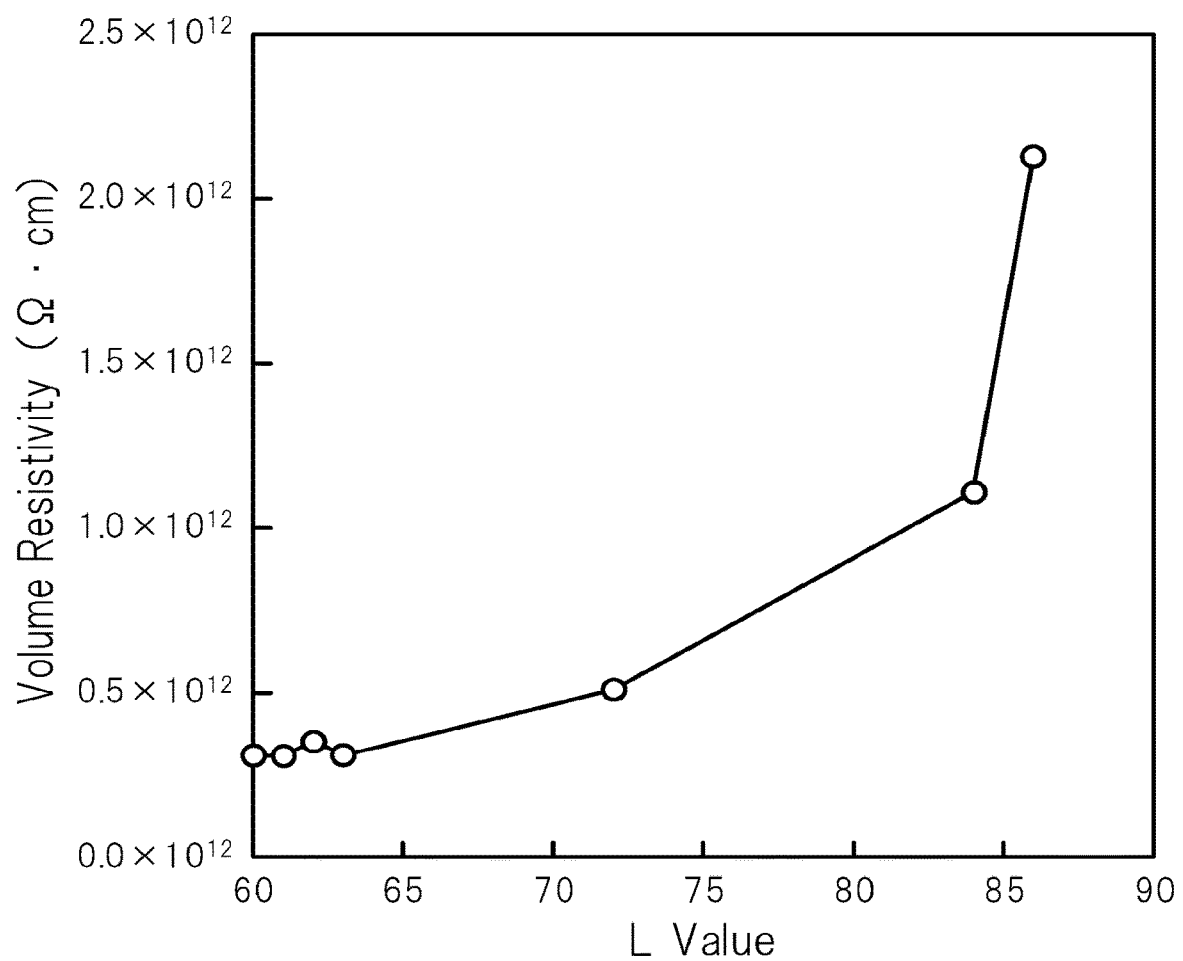
FIG. 4 is a graph showing a relationship between an L value of a lithium tantalate single crystal substrate and a volume resistivity thereof.

The L value (black: L=0, white: L=100) of the heat-treated lithium tantalate single crystal substrate was measured, using a spectrocolorimeter (NF555 by Nippon Denshoku Industries Co., Ltd.). The results are shown in Table 2. When reduction of the lithium tantalate single crystal substrate is insufficient, the lithium tantalate single crystal substrate is whitish and the L value thereof increases. A relationship between the L value of the lithium tantalate single crystal substrate and the volume resistivity thereof is shown in FIG. 4.

TABLE 1

|  | Temperature of Air Atmosphere | Relative Humidity (%) | Absolute Humidity (A) (g/m$^3$) | Time for Exposure to Air Atmosphere (B) (hr) | A × B ((g/m$^3$) · hr) | BET Specific Surface Area (m$^2$/g) | Inclination of Adsorption Isotherm |
|---|---|---|---|---|---|---|---|
| Lithium Carbonate Powder 1 | — | — | — | 0 | 0 | 0.123 | 0.001 |
| Lithium Carbonate Powder 2 | 20° C. | 50 | 8.7 | 12 | 104 | 0.124 | 0.027 |
| Lithium Carbonate Powder 3 | 20° C. | 50 | 8.7 | 168 | 1462 | 0.160 | 0.074 |
| Lithium Carbonate Powder 4 | 60° C. | 60 | 79.0 | 3 | 237 | 0.131 | 0.050 |
| Lithium Carbonate Powder 5 | 60° C. | 60 | 77.8 | 6 | 467 | 0.157 | 0.061 |
| Lithium Carbonate Powder 6 | 60° C. | 60 | 77.9 | 12 | 935 | 0.157 | 0.069 |
| Unused | — | — | — | — | — | 0.163 | 0.072 |

The BET specific surface area of the lithium carbonate powders 1 and 2 is smaller than that of the lithium carbonate powders 3 to 6, and from the adsorption isotherm in FIG. 1, it is known that a nitrogen gas hardly adsorbed to the lithium carbonate powders 1 and 2. On the other hand, the lithium carbonate powder 3, the lithium carbonate powder 5 and the lithium carbonate powder 6 were almost the same in point of the BET specific surface area and the adsorbed amount thereof. It is known that the BET specific surface area of the lithium carbonate powder 4 is smaller than that of the lithium carbonate powder 5 and the lithium carbonate powder 6.

exposure to air (exposure humidity), the BET specific surface area and the inclination of adsorption isotherm of lithium carbonate powder can be controlled. With that, it is known that, when the product of the absolute humidity and the time for exposure to air (exposure humidity) is controlled to be 200 (g/m$^3$)·hr or more, the BET specific surface area and the inclination of adsorption isotherm can be sufficiently increased. In addition, it is also known that, when the exposure humidity value is controlled to be 400 (g/m$^3$)·hr or more, the BET specific surface area and the inclination of adsorption isotherm can be increased up to around saturation values.

TABLE 2

|  | Lithium Carbonate Powder used for heat treatment | BET Specific Surface Area of Lithium Carbonate Powder (m$^2$/g) | Inclination of Adsorption Isotherm of Lithium Carbonate Powder | Volume Resistivity (Ω · cm) | L Value |
|---|---|---|---|---|---|
| Example 1 | Lithium Carbonate Powder 3 | 0.160 | 0.074 | 3.10 × 10$^{11}$ | 60 |
| Example 2 | Lithium Carbonate Powder 6 | 0.157 | 0.069 | 3.05 × 10$^{11}$ | 61 |
| Example 3 | Lithium Carbonate Powder 5 | 0.157 | 0.061 | 3.50 × 10$^{11}$ | 62 |
| Example 4 | Lithium Carbonate Powder 4 | 0.131 | 0.050 | 5.12 × 10$^{11}$ | 72 |
| Comparative Example 1 | Lithium Carbonate Powder 1 | 0.123 | 0.001 | 1.11 × 10$^{12}$ | 84 |
| Comparative Example 2 | Lithium Carbonate Powder 2 | 0.124 | 0.027 | 2.13 × 10$^{12}$ | 86 |
| Reference Example | Unused | 0.163 | 0.072 | 3.12 × 10$^{11}$ | 63 |

From FIG. 2, it is known that when the product of the absolute humidity and the time for exposure to air (exposure humidity) is 200 (g/m$^3$)·hr or more, the BET specific surface area can be fully restored. Further, when the exposure humidity is 400 (g/m$^3$)·hr or more, the BET specific surface area can be restored to a saturation specific surface area and, as a result, the gas adsorbed amount during reduction treatment can be kept constant. When the value is less than 200 (g/m$^3$)·hr like that of the lithium carbonate powder 1 and the lithium carbonate powder 2, it is considered that the BET specific surface area could not be restored sufficiently to cause fluctuation of reducing power of the powder.

From FIG. 2 and FIG. 3, it is known that, by controlling the product of the absolute humidity and the time for The volume resistivity of the lithium tantalate single crystal substrates of Examples 1 to 4 where a lithium tantalate single crystal substrate was heat-treated under normal pressure and at a temperature of 350° C. or higher but not higher than the Curie temperature thereof while buried in a used lithium carbonate powder having a BET specific surface area of 0.13 m$^2$/g or more was 1×10$^{10}$ Ω·cm or more and less than 1×10$^{12}$ Ω·cm. Though the volume resistivity of the lithium tantalate single crystal substrate of Example 4 is lower than the volume resistivity of the lithium tantalate single crystal substrates of Examples 1 to 3, the L value of the lithium tantalate single crystal substrate of Example 4 is higher than the L value of the lithium tantalate single crystal substrates of Examples 1 to 3. This may be considered because the fluctuation in reduction of the lithium tantalate single crystal substrate of Example 4 would be larger than that of the lithium tantalate single crystal substrates of Examples 1 to 3. From this, it is known that the BET specific surface area of a used lithium carbonate powder is preferably restored up to a saturation specific surface area. On the other hand, the volume resistivity of the lithium tantalate single crystal substrates of Comparative Examples 1 and 2 where a lithium tantalate single crystal substrate was heat-treated under normal pressure and at a temperature of 350° C. or higher but not higher than the Curie temperature thereof while buried in a used lithium carbonate powder having a BET specific surface area of less than 0.13 m$^2$/g was larger than $1\times10^{12}$ Ω·cm.

From FIG. 4, it is known that, when the lithium tantalate single crystal substrate is insufficiently reduced, the volume resistivity of the resultant lithium tantalate single crystal substrate is large.

The invention claimed is:

1. A method for producing a lithium tantalate single crystal substrate having a volume resistivity of $1\times10^{10}$ Ω·cm or more and less than $1\times10^{12}$ Ω·cm, comprising:
    heat-treating a lithium tantalate single crystal substrate having a volume resistivity of $1\times10^{12}$ Ω·cm or more and having a single-domain structure, under normal pressure and at a temperature of 350° C. or higher but not higher than the Curie temperature thereof while burying it in a lithium carbonate powder having a BET specific surface area of 0.13 m$^2$/g or more, wherein:
    the lithium carbonate powder is a used lithium carbonate powder that has been used in burying a lithium tantalate single crystal substrate in heat treatment for the lithium tantalate single crystal structure under normal pressure and at a temperature of 350° C. or higher but not higher than the Curie temperature thereof,
    in the heat treatment step, the heat treatment is carried out in a mixed gas atmosphere of an inert gas and a reducing gas at the start of the heat treatment, and after the heat treatment in the mixed gas atmosphere, the heat treatment is carried out in a single gas atmosphere of an inert gas, and
    in an adsorption isotherm obtained in measurement of the BET specific surface area of the lithium carbonate powder, in which the horizontal axis is a relative pressure (adsorption equilibrium pressure (P)/saturation vapor pressure (P$_0$)) and the vertical axis is an adsorbed amount (cm$^3$/g), the inclination of the adsorption isotherm is 0.04 or more at a relative pressure (P/P$_0$) falling within a range of 0.2 or more and 0.8 or less.

2. The method for producing a lithium tantalate single crystal substrate according to claim 1, wherein:
    the lithium carbonate powder is a lithium carbonate powder obtained by exposing the used lithium carbonate powder to an air atmosphere, and
    a product of the absolute humidity of the air atmosphere and the time for which the used lithium carbonate powder has been exposed to the air atmosphere is 200 (g/m$^3$)·hr or more.

3. The method for producing a lithium tantalate single crystal substrate according to claim 1, wherein:
    the lithium carbonate powder is a lithium carbonate powder obtained by exposing the used lithium carbonate powder to an air atmosphere, and
    a product of the absolute humidity of the air atmosphere and the time for which the used lithium carbonate powder has been exposed to the air atmosphere is 300 (g/m$^3$)·hr or more.

4. The method for producing a lithium tantalate single crystal substrate according to claim 1,
    wherein the lithium carbonate powder is a lithium carbonate powder obtained by exposing the used lithium carbonate powder to an air atmosphere,
    the absolute humidity of the air atmosphere is 40 g/m$^3$ or more, and
    a product of the absolute humidity of the air atmosphere and the time for which the used lithium carbonate powder has been exposed to the air atmosphere is 300 (g/m$^3$)·hr or more.

5. A method for producing a lithium tantalate single crystal substrate having a volume resistivity of $1\times10^{10}$ Ω·cm or more and less than $1\times10^{12}$ Ω·cm, comprising:
    heat-treating a lithium tantalate single crystal substrate having a volume resistivity of $1\times10^{12}$ Ω·cm or more and having a single-domain structure, under normal pressure and at a temperature of 350° C. or higher but not higher than the Curie temperature thereof while burying it in a lithium carbonate powder having a BET specific surface area of 0.13 m$^2$/g or more wherein:
    the lithium carbonate powder is a used lithium carbonate powder that has been used in burying a lithium tantalate single crystal substrate in heat treatment for the lithium tantalate single crystal structure under normal pressure and at a temperature of 350° C. or higher but not higher than the Curie temperature thereof,
    in the heat-treating, the heat-treating is carried out in a mixed gas atmosphere of an inert gas and a reducing gas at the start of the heat treatment, and after the heat-treating in the mixed gas atmosphere, the heat-treating is carried out in a single gas atmosphere of an inert gas,
    the lithium carbonate powder is a lithium carbonate powder obtained by exposing the used lithium carbonate powder to an air atmosphere, and
    a product of the absolute humidity of the air atmosphere and the time for which the used lithium carbonate powder has been exposed to the air atmosphere is 200 (g/m$^3$)·hr or more.

6. The method for producing a lithium tantalate single crystal substrate according to claim 5, wherein:
    the lithium carbonate powder is a lithium carbonate powder obtained by exposing the used lithium carbonate powder to an air atmosphere, and
    a product of the absolute humidity of the air atmosphere and the time for which the used lithium carbonate powder has been exposed to the air atmosphere is 300 (g/m$^3$)·hr or more.

7. The method for producing a lithium tantalate single crystal substrate according to claim 5,
    wherein the lithium carbonate powder is a lithium carbonate powder obtained by exposing the used lithium carbonate powder to an air atmosphere,
    the absolute humidity of the air atmosphere is 40 g/m$^3$ or more, and
    a product of the absolute humidity of the air atmosphere and the time for which the used lithium carbonate powder has been exposed to the air atmosphere is 300 (g/m$^3$)·hr or more.

8. A method for producing a lithium tantalate single crystal substrate having a volume resistivity of $1\times10^{10}$ Ω·cm or more and less than $1\times10^{12}$ Ω·cm, comprising:

heat-treating a lithium tantalate single crystal substrate having a volume resistivity of $1\times10^{12}$ Ω·cm or more and having a single domain structure, under normal pressure and at a temperature of 350° C. or higher but not higher than the Curie temperature thereof while burying it in a lithium carbonate powder having a BET specific surface area of 0.13 m²/g or more, wherein:

the lithium carbonate powder is a used lithium carbonate powder that has been used in burying a lithium tantalate single crystal substrate in heat treatment for the lithium tantalate single crystal structure under normal pressure and at a temperature of 350° C. or higher but not higher than the Curie temperature thereof, in the heat-treating, the heat-treating is carried out in a mixed gas atmosphere of an inert gas and a reducing gas at the start of the heat treatment, and after the heat-treating in the mixed gas atmosphere, the heat-treating is carried out in a single gas atmosphere of an inert gas, the lithium carbonate powder is a lithium carbonate powder obtained by exposing the used lithium carbonate powder to an air atmosphere, and a product of the absolute humidity of the air atmosphere and the time for which the used lithium carbonate powder has been exposed to the air atmosphere is 300 (g/m³)·hr or more.

9. The method for producing a lithium tantalate single crystal substrate according to claim 8, wherein the lithium carbonate powder is a lithium carbonate powder obtained by exposing the used lithium carbonate powder to an air atmosphere, and the absolute humidity of the air atmosphere is 40 g/m³ or more.

\* \* \* \* \*